US005430260A

United States Patent [19]

Koura et al.

[11] Patent Number: 5,430,260

[45] Date of Patent: Jul. 4, 1995

[54] SPEAKER SYSTEM

[75] Inventors: Satoshi Koura, Neyagawa; Shuji Saiki, Nara; Kazue Satoh, Neyagawa, all of Japan

[73] Assignee: Matsushita Electric Industrial Co., Ltd., Osaka, Japan

[21] Appl. No.: 28,947

[22] Filed: Mar. 8, 1993

[30] Foreign Application Priority Data

Mar. 11, 1992 [JP] Japan .................................. 4-052549

[51] Int. Cl.[6] .............................................. H05K 5/00
[52] U.S. Cl. .................................... 181/144; 181/199
[58] Field of Search ............... 181/144, 147, 148, 199, 181/152; 381/186, 24, 89, 90, 182

[56] References Cited

U.S. PATENT DOCUMENTS 4,885,782 12/1989 Eberbach ............................ 181/144

OTHER PUBLICATIONS

"1992 Yamaha Professional Audio Equipments", Yamaha Corporation, Jun. 1992.

"Quested Monitor", User's list 1988, Soundcraft Japan Ltd.

*Primary Examiner*—Khanh Dang
*Attorney, Agent, or Firm*—Wenderoth, Lind & Ponack

[57] ABSTRACT

In a speaker system capable of controlling the directivity, a first pair of speaker units are disposed at a cabinet from face having vertical and horizontal axes, so that the diaphragm centers are located along a line which is parallel with the horizontal axis of the front face. A second pair of speaker units are disposed so that the diaphragm centers are located along a line which is parallel with the vertical axis of the front face. The horizontal distance between the centers of the diaphragms of the first pair of speaker units and the vertical distance between the centers of the second pair of speaker units are different from each other. The center of the line which links the diaphragm centers of the first pair of speaker units and the center of the line which links the diaphragm centers of the second pair of speaker units are located at the same position. A fifth speaker unit may be disposed on the front face of the cabinet at a center of an area surrounded by the first and second pair of speaker units.

2 Claims, 8 Drawing Sheets

SPEAKER SYSTEM

BACKGROUND OF THE INVENTION

1. Field of the Invention

The present invention relates to a speaker system using a plurality of speaker units.

2. Description of the Prior Art

Recently, as digital signal processing technology has been dramatically advanced, the electrical signals supplied to speaker systems have notably improved in quality, and accordingly there is an increased demand for a speaker system capable of reproducing sound at a high sound quality. For high quality sound reproduction, the speaker system must be free from large fluctuations in the sound pressure frequency characteristics depending on the sound listening position. For this purpose, it is necessary to minimize the effects of reflected sound from the walls and floor of the listening room, and it is preferable to develop a speaker system in which the directivity is controlled in a wide frequency band so that sound is not radiated to areas other than the listening position. In the low frequency range, however, the wavelength of the sound wave is long and the directivity is nondirectional, so that it is difficult to control a directivity. Especially in the speaker system using one speaker unit for bass reproduction, since the directivity is determined by the size of the diaphragm of the speaker unit, it is difficult to control the directivity in the low frequency range.

As the means for solving this problem, there is a commercial speaker system which has four speaker units for bass reproduction disposed at four corners of a rectangle to virtually increase the size of the diaphragm, and to control the directivity in the range down to the low frequency range.

in such a prior art, system the directivity is determined by the disposition intervals of the speaker units. Therefore, to have directional directivity in the low frequency range, it is enough to widen the disposition intervals of the speaker units in the horizontal direction and the vertical direction. As the intervals become wider, however, the sound pressure level of the side lobes increase in the directivity pattern, and the side lobes are generated in relatively lower frequency range, thereby deteriorating the directivity. In a speaker system, moreover, it Is desirable for the sound pressure frequency characteristic be axis-symmetrical with respect to its central axis, and hence a speaker unit for sound reproduction in medium and high frequency ranges is disposed in the central part of the area surrounded by the Four speaker units for sound reproduction in the low frequency range. Herein, to control the directivity characteristics in the medium and high frequency ranges, a horn speaker is generally used for the speaker for sound reproduction in the medium and high frequency ranges. To control the directivity in the frequency range from the medium frequency range by the horn speaker, the control band of the directivity is determined by the size of the horn mouth. Since the mouth is considerably large, the disposition intervals of the speaker units for sound reproduction in the low frequency range must be set larger than the diameter of the horn mouth. Therefore, when a speaker system is composed by dividing the frequency band into a low frequency band and a medium and high frequency band by a dividing network, the effects of side lobes appear in the reproduction band due to the directivity of the speaker for sound reproduction in the low frequency range, and a large disturbance occurs in the sound pressure frequency characteristic near the crossover frequency with respect to the medium and high frequency range. Therefore, to obtain favorable directivity as the speaker system, the crossover frequency of the dividing network must be set in a to a very low frequency band so as to be free from effects of the side lobes of the speaker for sound reproduction in the low frequency range. However, in the horn speaker for sound reproduction in the medium and high frequency range, the sound pressure level is lowered in the low frequency range because the acoustical load of the horn is not applied, and the distortion increases, so that sufficient quality reproduction sound is not obtained from the speaker system.

SUMMARY OF THE INVENTION

It is hence a primary object of the invention to realize a speaker system in which the directivity can be controlled in a wide frequency band including the low frequency range.

To achieve the above object, according to the present invention, a first pair of speaker units are disposed on a front face of a, cabinet having vertical and horizontal axis at a specific horizontal interval distance therebetween so that, the centers of the diaphragms thereof are located substantially along a line which is parallel to the horizontal axis of the face (at positions on substantially the same horizontal line), and a second pair of speaker units are disposed on the front face of tile cabinet at a specific vertical distance therebetween so that the centers of diaphragms thereof are located substantially along a line which is parallel to the vertical axis of the face (at positions on substantial the same vertical line). The first and second pairs of speaker units are arranged such that the center of a line which links the centers of the diaphragms of the first pair of speaker units and a center of the line which links the centers of the diaphragms of the second pair of speaker units are located at substantially a same position.

Further, an additional speaker unit may be disposed on the front face of the cabinet at a center of an area surrounded by the first and second pairs of speaker units. In this case, each of the first and second pairs of speaker units may be a speaker unit for sound reproduction in a low frequency range lower than a specific crossover frequency and the additional speaker unit may be a speaker unit for sound reproduction in a middle and high frequency range higher than the crossover frequency. In this arrangement, a speaker system having an arbitrary desired directivity can be obtained in a wide frequency band including the low frequency range and the middle and high frequency range.

In this constitution, the directivity of the set of the four speaker units for sound reproduction in the low frequency range in the horizontal direction is dominated not only by the horizontal interval of the first pair of speaker units, but also by the second pair of speaker units disposed at an interval in the vertical direction. Likewise, the directivity in the vertical direction is dominated not only by the vertical interval of the second pair of speaker units, but also by the first pair of speaker units disposed an interval in the horizontal direction. As a result, sharpness of the directivity in each of the horizontal direction and vertical direction is smoothed, so that the frequency at which the side lobes are generated becomes high, and the sound pressure level is lowered. Therefore, by keeping wide intervals of the positions of the four speaker units for sound reproduction in the low frequency range, and by disposing a speaker unit for sound reproduction in the medium and high frequency range with a wide mouth such as a horn speaker in the central part of the area surrounded by the four speaker units, it is possible to suppress the disturbance of the directivity by the side lobe near the crossover frequency of the dividing network, so that a directivity free from disturbance even in the low frequency range can be realized.

FIGS. *2a* and *2b* consist of a front view and a sectional diagram showing a structure of a general speaker unit.

Figure 3:
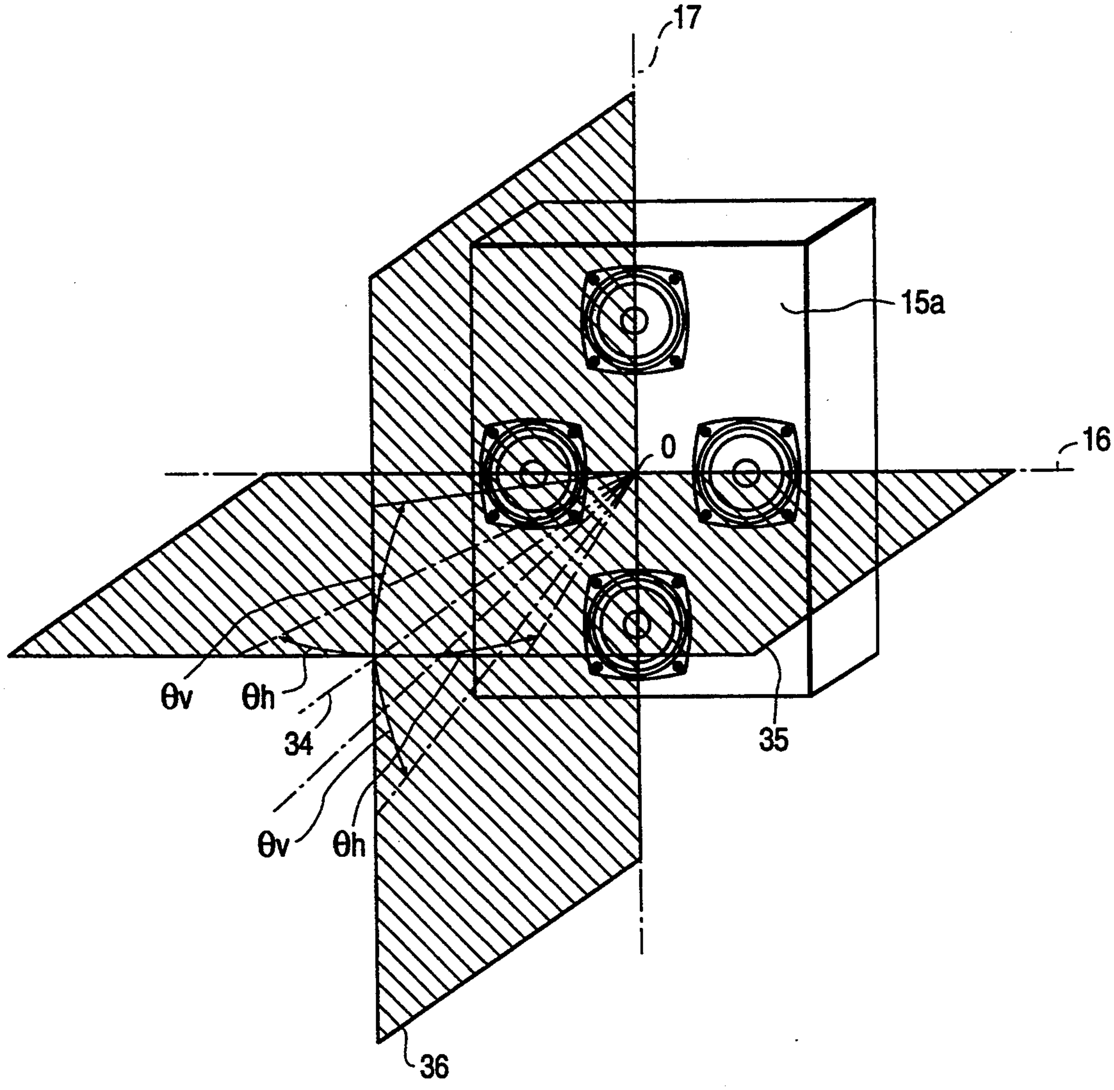

FIG. 3 is a diagram showing a directivity angle of a speaker system.

FIGS. *4a* and *4b* are respectively directivity diagrams in the horizontal direction and vertical direction of the speaker system in accordance with of the present invention the first embodiment.

Figure 5:
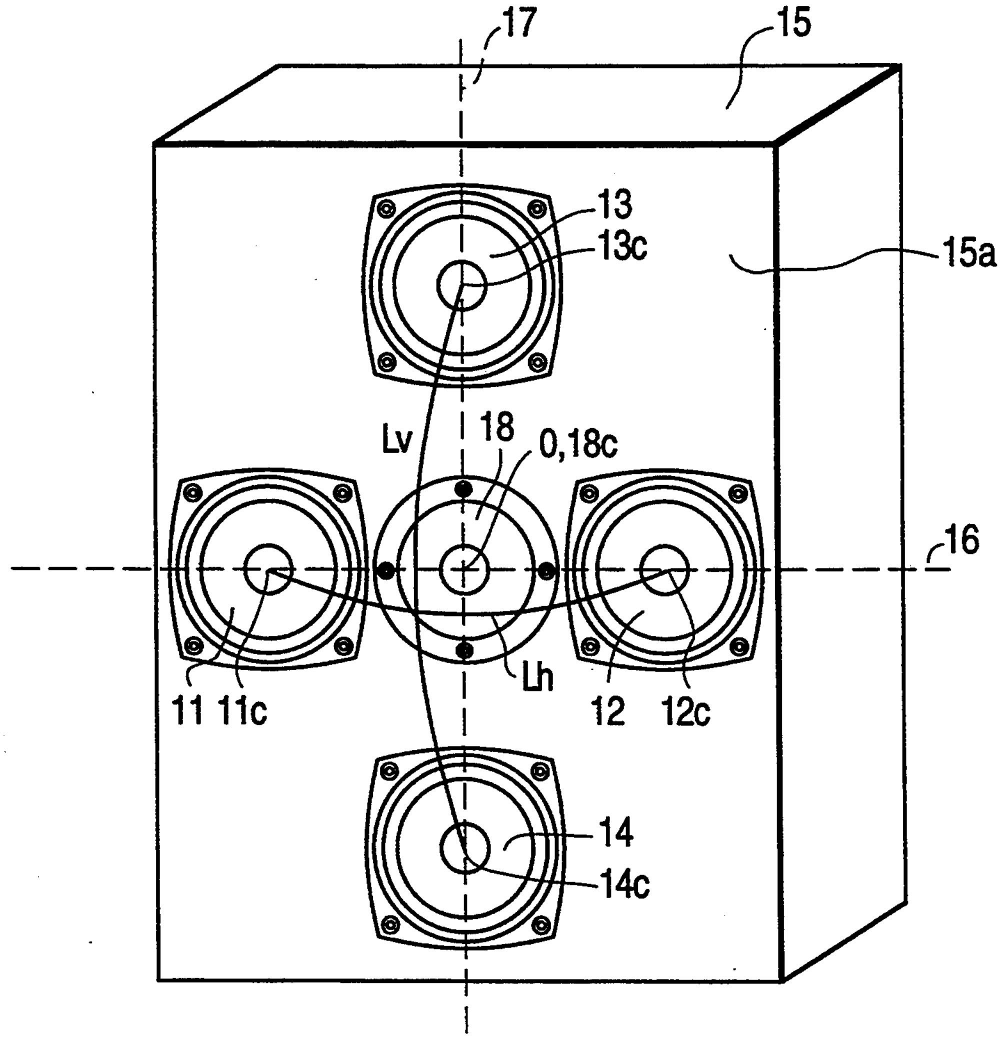

FIG. 5 is a front perspective view of a speaker system in a second embodiment accordance with of the present invention of the invention.

FIGS. *6a* and *6b* are respectively directivity diagrams in the horizontal direction and vertical direction of the speaker system in the second embodiment.

DESCRIPTION OF THE PREFERRED EMBODIMENTS

Figure 1:
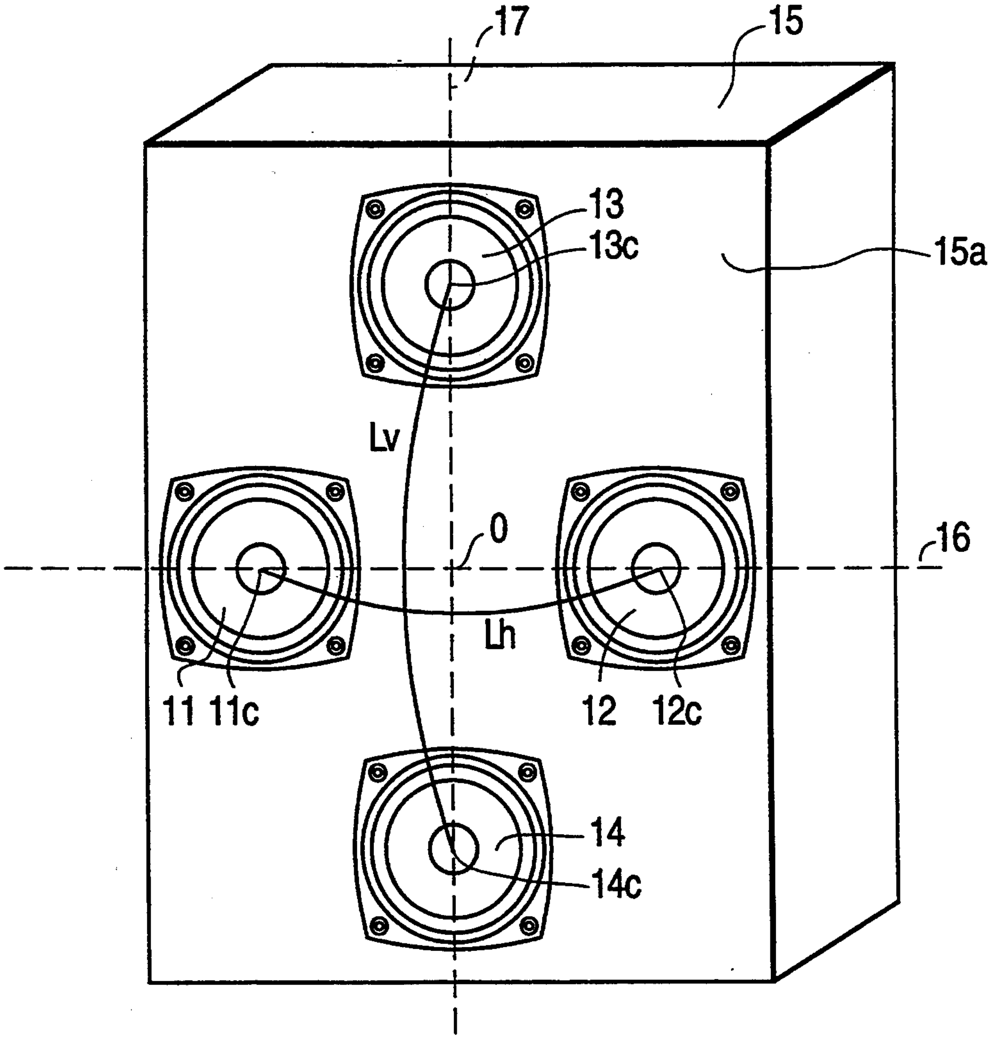
FIG. 1 is a front perspective view of a speaker system in accordance with a first embodiment of the present invention.
Figure 2A:
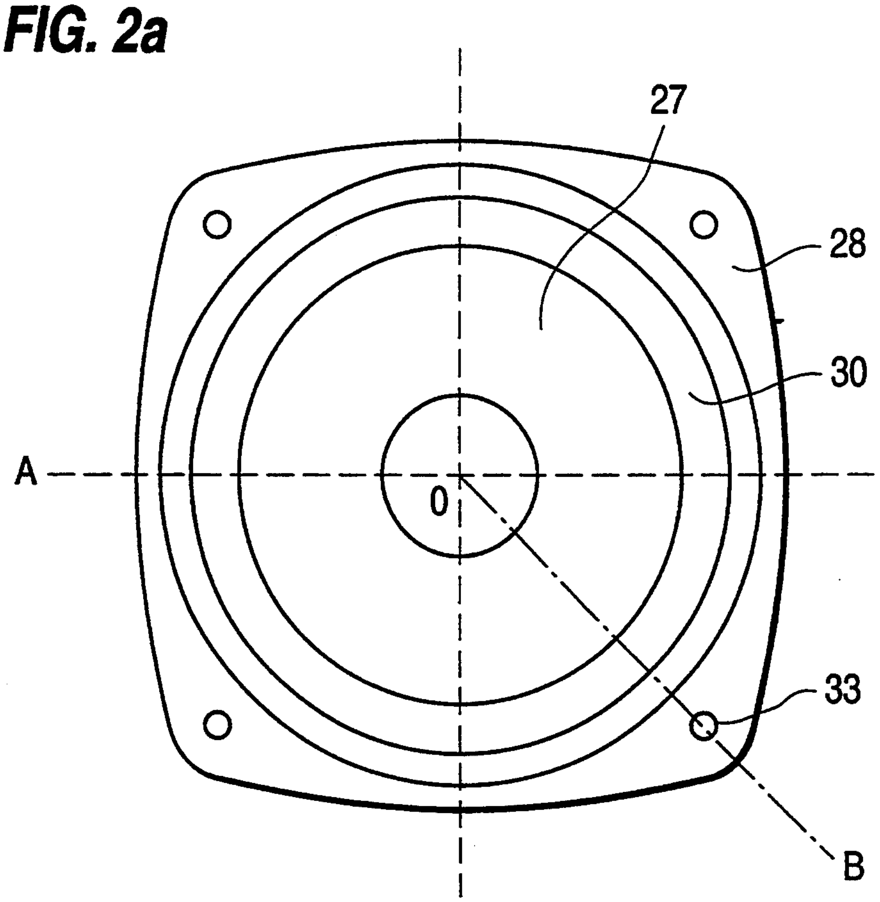
Figure 2B:
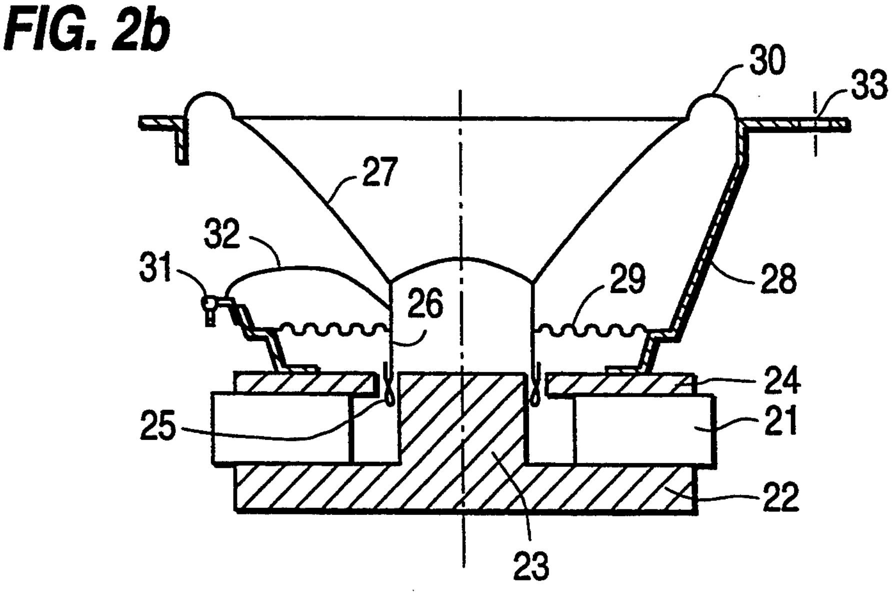

A speaker system in accordance with a first embodiment of the and present invention is shown in FIG. 1. Speaker units 11, 12, 13, 14 are disposed on a flat cabinet front face 15*a* of a rectangular parallelepiped cabinet 15. The speaker units 11, and 12 are disposed so that the centers 11*c* and 12*c* of their diaphragms are located substantially on the same horizontal line, and the speaker units 13, and 14 are disposed so that the centers 13*c* anti 14*c* of their diaphragms are located substantially on the same vertical line. A horizontal line 16 and a vertical line 17 shown in FIG. 1 are respectively a horizontal axis and a vertical axis passing through a specified origin O on the cabinet front face 15*a*.

Prior to a specific description of the embodiment, a construction of a general speaker unit is briefly explained below. FIG. *2a* and *2b* consist of a front view and a structural sectional view of a dynamic speaker unit. An under-plate 22 is affixed to a lower surface of a magnet 21. A center pole 23 is disposed so as to be integrated with the middle part of the under-plate 22. A top plate 24 forming a magnetic gap with the center pole 23 is affixed to an upper surface of the magnet 21. A voice coil 25 responsive to an electrical signal is held in the magnetic gap. A voice coil bobbin 26 transmits a driving force generated in the voice coil 25 to the vibration system. A conical diaphragm 27 having a dome shape in the central part is affixed to a front end of the voice coil bobbin 26. A frame 28 is affixed to an upper surface of the top plate 24. A damper 29 has an inner circumference affixed to an intermediate position of the voice coil bobbin 26, and an outer circumference affixed to the frame 28. An edge 30 has an inner circumference affixed to an outer circumference of the diaphragm 27, and an outer circumference affixed to the frame 28. A terminal 31 is affixed to the frame 28. A tinsel cord 32 for supplying the electrical signal to the voice coil 25 is connected at one end thereof to the terminal 31 and at the other end to a mid part of the voice coil bobbin 26. Screw holes 33 for mounting the speaker unit on the cabinet front face are opened in the outer circumference of the frame 28. The speaker unit shown in FIG. *2a–2b* may be used as each of the speaker units 11, 12, 13 and 14 shown in FIG. 1. Of course, speaker units having other structures may be equally employed.

In the speaker system shown in FIG. 1, two speaker units 11 and 12 are disposed on the cabinet front face 15*a*, at a specific horizontal interval between outer ends of the frames of the speaker units so that the centers 11*c* and 12*c* of the diaphragms of the speaker units are located on a same horizontal line (i.e., same in vertical position). The interval of the speaker units 11 and 12 is defined so that the distance between the centers 11*c*, and 12*c* of the diaphragms is Lh. The other two speaker units 13 and 14 are disposed at a specific vertical interval between outer ends of the frames of the speaker units so that the centers 13*c* and 14*c* of the diaphragms of the speaker units are located on a same vertical line (i.e., same in horizontal position). The interval of the speaker units 13 and 14 is defined so that the distance between the centers 13*c*, and 14*c* of the diaphragms is Lv. The speaker units 11, 12, 13, and 14 are disposed so that the center of a line linking the centers 11*c*, and 12*c* of the diaphragms and the center of a line linking the centers 13*c*, and 14*c* of the diaphragms are substantially coincide with each other. In other words, the horizontal position and vertical position of the center of the line linking the centers 11*c*, and 12*c* of the diaphragms, or the horizontal position and vertical position of the center of the line linking the centers 13*c*, and 14*c* of the diaphragms are substantially the same as the origin O at the intersection of the horizontal axis 16 and the vertical axis 17 on the cabinet front face 15*a*. Besides, the line linking the centers 11*c*, and 12*c* of the diaphragms and the horizontal axis 16 are parallel to each other, while the line linking the centers 13*c*, and 14*c* of the diaphragms and the vertical axis 17 are parallel to each other. If the distance between a plane fully contacting the cabinet front face 15*a* and each of the diaphragm centers 11*c*, and 12*c*, 13*c*, 14*c* can be ignored, the line linking tile diaphragm centers 11*c* and 12*c* and the horizontal axis 16 may be regarded to coincide with each other, and the line linking the diaphragm centers 13*c* and 14*c* and the vertical axis 17 may be regarded to coincide with each other.

At this time, one preferable example may be such that each of the horizontal interval of the outer ends of the frames of the speaker units 11, and 12 and the vertical interval of the outer ends of the speaker units 13, and 14 is approximately equal to the diameter of the diaphragm of one speaker unit.

In this constitution, according to the speaker system of the invention, since the two speaker units 13, and 14 disposed in the vertical direction at a distance Lv between the centers 13*c* and 14*c* of the diaphragms are located at the horizontal position in the middle between the two speaker units 11, and 12 disposed in the horizontal direction at a distance Lh between the centers 11*c* and 12*c* of the diaphragms, the sharpness of the directivity in the horizontal direction of the pair of the speaker units 11, and 12 is smoothed. Likewise, since the two speaker units 11, and 12 disposed in the horizontal direction at a distance Lh between the centers 11*c* and 12*c* of the diaphragms are located at the vertical position in the middle between the two speaker units 13, and 14 disposed in the vertical direction at a distance Lv between the centers 13*c* and 14*c* of the diaphragms, the sharpness of the directivity in the horizontal direction of the pair of the speaker units 13, and 14 is smoothed. Therefore, by the arrangement of the four speaker units 11, 12, 13, and 14 in this embodiment, the frequency at which the side lobes are generated is higher than in the conventional constitution.

The directivity angle of the speaker system of the embodiment is described below with reference to FIG. 3. FIG. 3 shows a central axis 34 as the normal of the cabinet front face 15*a* passing through the origin O, a horizontal plane 35 formed by the horizontal axis 16 and the central axis 34, and a vertical plane 36 formed by the vertical axis 17 and central axis 34. The same constituent elements as in FIG. 1 are identified by the same reference numbers. The angle $\theta$h formed when the central axis 34 is rotated within the horizontal plane 35 about the origin O is defined as a directivity angle in the horizontal direction, and the angle $\theta$v formed when the central axis 34 is rotated within the vertical plane 36 about the origin O is defined as a directivity angle in the vertical direction.

Figure 4A:
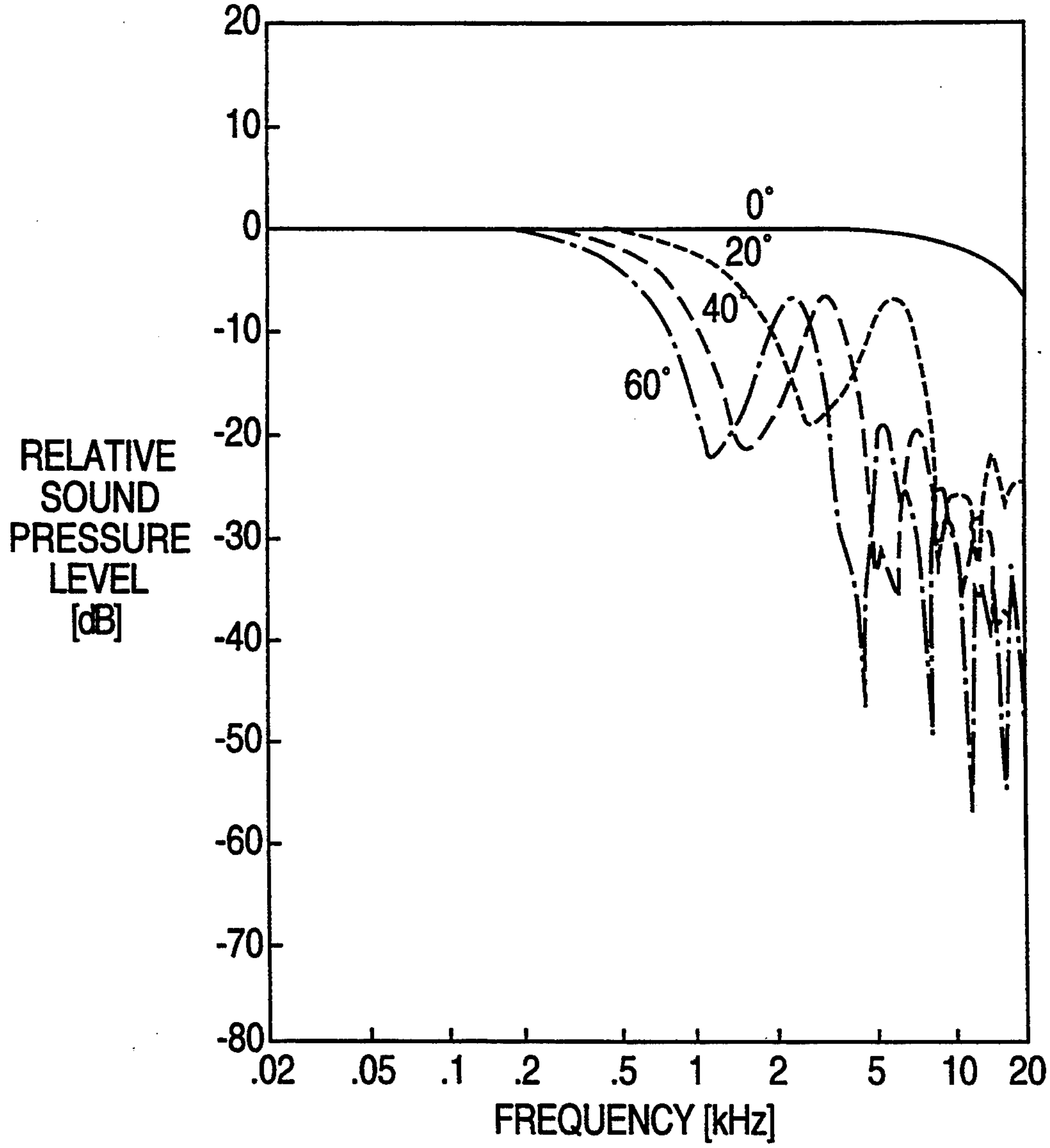
Figure 4B:
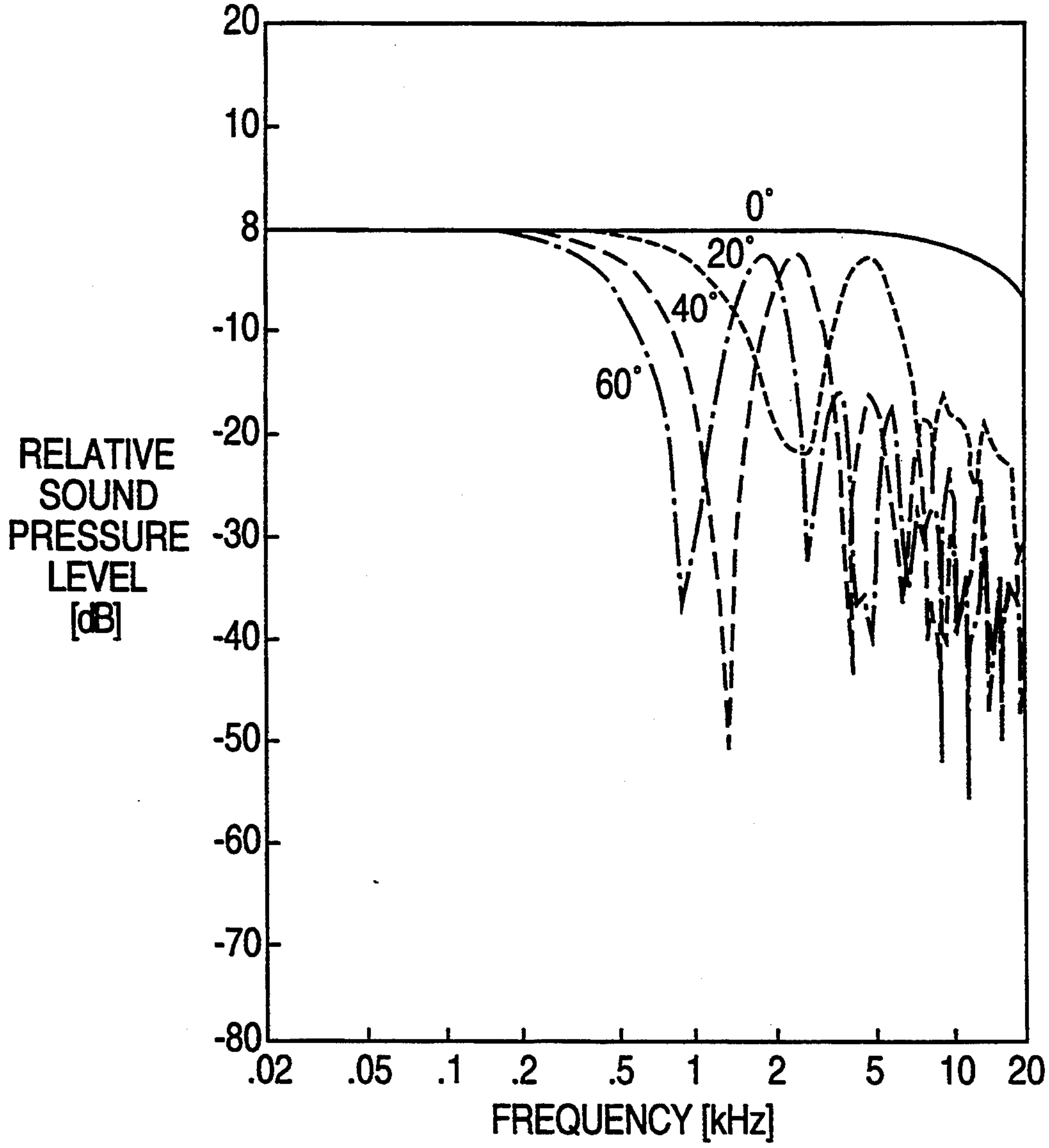

Examples of the directivity in the horizontal direction and vertical direction of the first embodiment are shown in FIGS. 4*a*, and 4*b*, respectively. The directivity at each of directivity angles of 0, 20, 40 and 60 degrees are shown. The shown directivity patterns are calculated by assuming the distance between the diaphragm centers 11*c*, and 12*c* of the speaker units 11, and 12 to be Lh=290 mm, the distance between the diaphragm centers 13*c*, and 14*c* of the speaker units 13 and 14 to be Lv=400 mm, and each of the diaphragms of the speaker units 11, 12, 13, and 14 to be a circular plane surface sound source having a radius of 54 mm. In FIGS. 4*a*, and 4*b*, the relative sound pressure level refers to the difference of the sound pressure level at each of the directivity angles 20, 40 and 60 degrees from the sound pressure level at directivity angle 0 degree assumed to be 0 dB. It is known from the characteristics in FIGS. 4*a*, and 4*b* that the frequency at which the side lobe is generated is relatively high, and that the sound pressure level of the side lobes is low.

Generally, in a listening room, the distance between the ceiling and the floor is small, and the sound radiated From the speaker is likely to be reflected by the ceiling and floor. Hence, in the embodiment, the speaker units 11, 12, 13, and 14 are disposed so that the distance Lv between the diaphragm centers 13*c*, and 14*c* of the two speaker units 13, and 14 is longer than the distance Lh between the diaphragm centers 11*c*, and 12*c* of the other two speaker units 11, and 12, thereby making the directivity in the vertical direction narrower than the directivity in the horizontal direction. By varying the disposition intervals of the speaker units 11, 12, 13, and 14 depending on the ambient environments, the directivity can be varied arbitrarily in each of the horizontal direction and vertical direction.

In the embodiment, meanwhile, the speaker units 11, and 12 are disposed so that their diaphragm centers 11*c*, and 12*c* are located at the same vertical position (the positions on the same horizontal line), but the speaker units 11, and 12 may be disposed substantially at the same vertical position by allowing a difference of less than the radius of the diaphragm in the vertical position of their diaphragm centers 11*c*, and 12*c*. Likewise, the speaker units 13, and 14 are disposed so that their diaphragm centers 13*c*, and 14*c* are located at the same horizontal position (the positions on the same vertical line), but the speaker units 13, and 14 may be disposed substantially at the same horizontal position by allowing a difference of less than the radius of the diaphragm in the horizontal position of their diaphragm centers 13*c*, and 14*c*.

In the embodiment, moreover, the speaker units 11, 12, 13, and 14 are arranged so that the center of the line linking the diaphragm centers 11*c*, and 12*c* of the speaker units 11, and 12, and the center of the line linking the diaphragm centers 13*c*, and 14*c* of the speaker units 13, and 14 coincide with each other, but a distance difference of less than the radius of diaphragm may be allowed between the center of the line linking the diaphragm centers 11*c*, and 12*c* and the center of the line linking the diaphragm centers 13*c*. and 14*c*, and the speaker units 11, 12, 13, and 14 may be disposed so that the center of the line linking the diaphragm centers 11*c*, and 12*c* and the center of the line linking the diaphragm centers 13*c*, 14*c* may substantially coincide with each other.

Yet, in the embodiment, the shape of the cabinet 15 is a rectangular parallelepiped, and the shape of the front face 15*a* is a flat plane, but such shape is not limitative, and, for example, the cabinet front face 15*a* may be a curved surface or a polyhedron.

In the embodiment, still more, the frame upper surfaces of the four speaker units 11, 12, 13, and 14 are disposed so as to contact the same plane, and all normals of the speaker units 11, 12, 13, and 14 passing through the diaphragm centers 11*c*, 12*c*, 13*c*, and 14*c* are parallel to one another, but the normals passing through the diaphragm centers 11*c*, 12*c*, 13*c*, and 14*c* of the speaker units 11, 12, 13, and 14 may not be always parallel to one another as long as the speaker units 11, 12, 13, and 14 are disposed on the cabinet front face 15*a*, and may not be parallel to the normal direction of the cabinet front face 15*a*.

A second embodiment is shown in FIG. 5. In FIG. 5, the same constituent parts as in the first embodiment in FIG. 1 are identified by the same reference numbers.

What is different from the first embodiment is that a speaker unit 18 different from the speaker units 11, 12, 13, and 14 is newly added to the speaker system of the first embodiment so that its diaphragm center 18*c* is located at the origin O. The four speaker units 11, 12, 13, and 14 are used for sound reproduction in the low frequency range, and the speaker unit 18 is used for sound reproduction in the medium and high frequency range. The speaker unit for sound reproduction in the low frequency range refers to a speaker unit which is capable of obtaining a sufficient reproduction sound pressure level stably in the low frequency range, inclined to increase harmonic distortion components in the reproduction sound as the reproduction sound pressure level drops in the higher frequency range, and incapable of obtaining such a satisfactory reproduction sound as in the low frequency range. On the other hand, the speaker unit for sound reproduction in the medium and high frequency range refers to a speaker unit which is capable of obtaining a sufficient reproduction sound pressure level stably in the medium and high frequency range, inclined to increase harmonic distortion components in the reproduction sound as the reproduction sound pressure level drops in the lower frequency range, and incapable of obtaining such a satisfactory reproduction sound as in the medium and high frequency range. Therefore, when adding the speaker unit 18 for sound reproduction in the medium and high frequency range to the speaker system of the first embodiment, only the signals in the low frequency range are fed into the speaker units 11, 12, 13, and 14 for sound reproduction in the low frequency range so that a sufficient reproduction sound is reproduced in the low frequency range by the speaker units 11, 12, 13, and 14, and only the signals in the medium and high frequency range are fed into the speaker unit 18 for sound reproduction in the medium and high frequency range so that a sufficient reproduction sound is reproduced in the medium and high frequency range by the speaker unit 18. At this time, by adjusting the reproduction sound pressure level of the entire set of the speaker units 11, 12, 13, and 14 for sound reproduction in the low frequency range, and the reproduction sound pressure level of the speaker unit 18 for sound reproduction in the medium and high frequency range, a stable reproduction sound pressure level is obtained in the wide band from the low frequency range to the medium and high frequency range. Such an electrical circuit for dividing a signal into a low frequency band and a medium and high frequency band and for feeding the band divided signal components into the set of the speaker units 11, 12, 13 and 14 and the speaker unit 18 is called a dividing network, anti the frequency at which the signal frequency band is divided into two bands is called the crossover frequency. The dividing network itself is known in the art, and a practical electrical circuit thereof may be composed in various known manners.

In the second embodiment, the behavior of the set of the speaker units 11, 12, 13, and 14 in the low frequency range is the same as in the first embodiment. Therefore, in the directivity of the set of the speaker units 11, 12, 13, 14 in the low frequency range, the frequency at which the side lobe is generated is high, and the sound pressure level of the side lobe is lowered. Therefore, it is easier to set the crossover frequency of the dividing network for the speaker units 11, 12, 13, and 14 and the speaker unit 18 in a band free from effects of the side lobes are of the set of the speaker units 11, 12, 13, and 14, hence, directivity free from disturbance from the low Frequency range can be obtained.

Figure 6A:
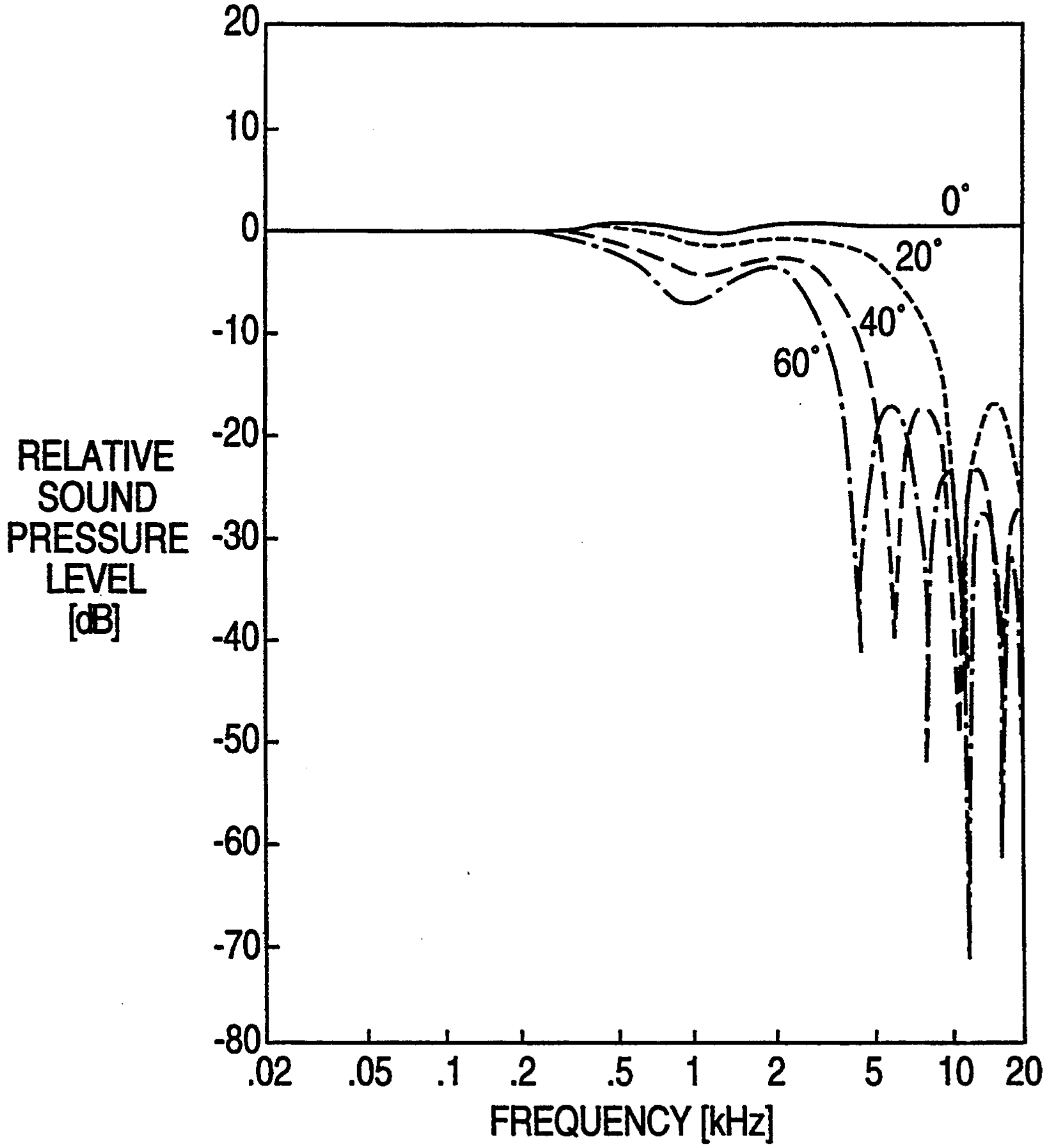
Figure 6B:
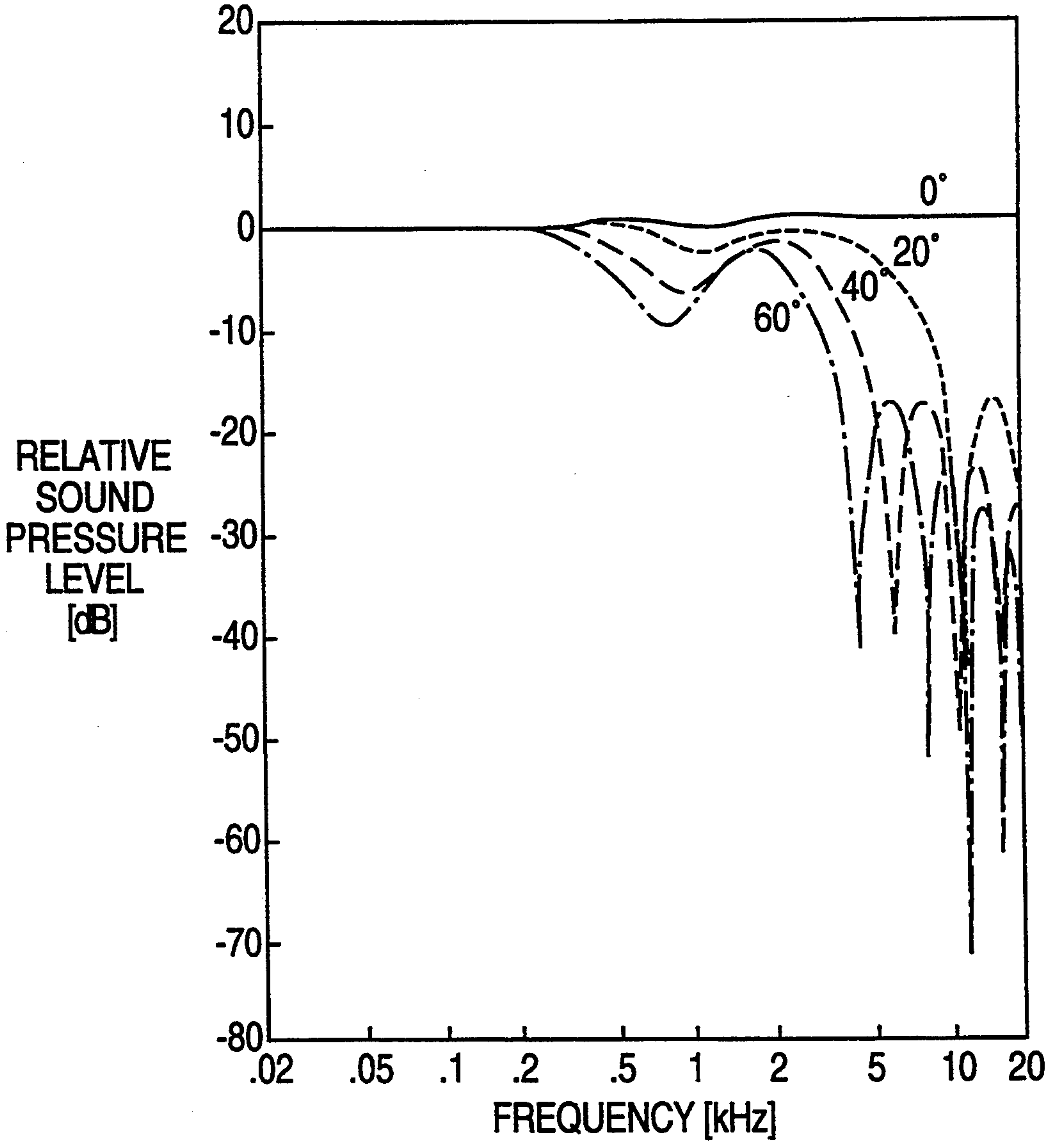

Shown below is an example of calculation of the directivity of the speaker system in which the band is divided into the low frequency band and the medium and high frequency band by a dividing network. In the same way as in the first embodiment, assuming the distance between the diaphragm centers 11*c*, and 12*c* of the speaker units 11, and 12 to be Lh =290 mm, the distance between the diaphragm centers 13*c*, and 14*c* of the speaker units 13, 14 to be Lv=400 mm, each of the diaphragms of the speaker units 11, 12, 13, and 14 to be a plane surface sound source having a radius of 54 mm, the diaphragm of the speaker unit 18 to be a plane surface sound source having a radius of 110 mm, and the crossover frequency of the dividing network to be 1.2 kHz, the directivity patterns in the horizontal direction and vertical direction calculated at the speaker system directivity angles of 0, 20, 40 and 60 degrees are respectively shown in FIGS. 6*a*, and 6*b*. It is known from FIGS. 6*a*, and 6*b* that there is no significant disturbance due to effects of the side lobes in the directivity pattern along with the increase in the directivity angle in the vicinity of the crossover frequency.

Here, the reason why the radius of the diaphragm of the speaker unit 18 is made large as 110 mm will be described. When the directivity is calculated by using a flat plane sound source, the sharpness of the directivity will be loosened more and the frequency at which the side lobe is generated will become higher with an increase of the area of the diaphragm. Accordingly, a speaker unit having a large diaphragm can be regarded as a speaker unit whose directivity is controlled to a certain extent. In other words, if the speaker unit 18 has the same directivity as that of the flat plane sound source having a large radius as 110 mm, it is possible to realize a directivity of the entire speaker system controlled to be less disturbed in the wide frequency band including the low frequency range in the arrangement shown in FIG. 5.

Incidentally, even if the distance Lh between diaphragm centers 11*c*, and 12*c* of the speaker units 11 and 12, and the distance Lv between diaphragm centers 13*c*, and 14*c* of the speaker units 13 and 14 are made sufficiently large, the disturbance of the directivity due to effects of side lobes is small. Accordingly, a horn speaker with a wide mouth can be used for the speaker unit for sound reproduction in the medium and high frequency range, so that the directivity can be sufficiently controlled in a wide range.

In this embodiment, the horizontal position and vertical position of the diaphragm center 18*c* of the speaker unit 18 are matched with the horizontal position and vertical position of the origin O on the cabinet front face 15*a*, but a slight difference may be allowed between the horizontal position or vertical position of the diaphragm center 18*c* and the horizontal position or vertical position of the origin O, as long as the positions substantially coincide each other.

What is claimed is:

1. A speaker system comprising:

a cabinet having a front surface having vertical and horizontal axes;

first and second speaker units each having a diaphragm with a center, said first and second speaker units being disposed on the front surface of the cabinet at a specific horizontal distance therebetween so that said centers of said diaphragms thereof are located along a line which is parallel to said horizontal axis of said front surface;

third and fourth speaker units each having a diaphragm with a center, said third and fourth speaker units being disposed on the front surface of the cabinet at a specific vertical distance therebetween so that said centers of said diaphragms thereof are located along a line which is parallel to said vertical axis of said front surface;

the first through fourth speaker units being arranged such that a center of said line which links the centers of the diaphragms of the first and second speaker units and a center of said line which links the centers of the diaphragms of the third and fourth speaker units are located at a same position; and a fifth speaker unit disposed on the front surface of the cabinet at a center of an area surrounded by the first through fourth speaker units;

wherein a horizontal distance between the centers of the diaphragms of the first and second speaker units and a vertical distance between the centers of the diaphragms of the third and fourth speaker units are different from each other.

2. A speaker system according to claim 1, wherein each of the first through fourth speaker units is a speaker unit for reproducing sound in a first frequency range and the fifth speaker unit is a speaker unit for reproducing sound in a second frequency range which is higher in frequency than said first frequency range.

* * * * *